United States Patent
Miller et al.

(10) Patent No.: US 11,791,441 B2
(45) Date of Patent: Oct. 17, 2023

(54) SUPPORT STRUCTURES FOR LIGHT EMITTING DIODE PACKAGES

(71) Applicant: CreeLED, Inc., Durham, NC (US)

(72) Inventors: Derek Miller, Raleigh, NC (US);
Robert Wilcox, Rolesville, NC (US);
Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 112 days.

(21) Appl. No.: 17/123,381

(22) Filed: Dec. 16, 2020

(65) Prior Publication Data

US 2022/0190208 A1    Jun. 16, 2022

(51) Int. Cl.
| | |
|---|---|
| *H01L 33/48* | (2010.01) |
| *H01L 33/46* | (2010.01) |
| *H01L 33/60* | (2010.01) |
| *H01L 33/62* | (2010.01) |
| *H01L 33/58* | (2010.01) |

(52) U.S. Cl.
CPC ............ *H01L 33/486* (2013.01); *H01L 33/46* (2013.01); *H01L 33/60* (2013.01)

(58) Field of Classification Search
CPC ........ H01L 33/486; H01L 33/60; H01L 33/46
See application file for complete search history.

(56) References Cited

U.S. PATENT DOCUMENTS

| | | | |
|---|---|---|---|
| 10,290,777 B2 | 5/2019 | Andrews et al. | |
| 2011/0175132 A1 | 7/2011 | Kwon et al. | |
| 2013/0119417 A1 | 5/2013 | Andrews et al. | |
| 2013/0322068 A1 | 12/2013 | Clark et al. | |
| 2019/0363223 A1 | 11/2019 | Murthy et al. | |
| 2019/0363232 A1 | 11/2019 | Murthy et al. | |

(Continued)

FOREIGN PATENT DOCUMENTS

| | | | | |
|---|---|---|---|---|
| JP | 5866561 B1 * | 2/2016 | ............. | H01L 33/38 |
| WO | WO-2018096571 A1 * | 5/2018 | ............. | H01L 33/26 |

OTHER PUBLICATIONS

International Search Report and Written Opinion for International Patent Application No. PCT/US2021/063244, dated Apr. 25, 2022, 15 pages.

*Primary Examiner* — Antonio B Crite

(74) *Attorney, Agent, or Firm* — Withrow & Terranova, P.L.L.C.

(57) ABSTRACT

Solid-state lighting devices including light-emitting diodes (LEDs), and more particularly support structures for LED packages are disclosed. Support structure arrangements are provided for LED packages with increased reflectivity. Support structures may include patterned electrically conductive materials that provide electrical connections and bonding surfaces for LED chips within the package, and bonding surfaces for cover structures in certain arrangements. Depending on the wavelengths of light emitted by the LED package, light reflectivity tradeoffs can exist for conductive materials that provide suitable electrical connections and bonding surfaces. Additional patterned layers with increased reflectivity may be provided on underlying patterned electrically conductive materials. The patterned layers with increased reflectivity may be arranged in areas of the LED package where light may impinge surfaces of the LED package that are outside of one or more of a die attach area and a cover structure mounting area for the LED package.

28 Claims, 9 Drawing Sheets

(56) References Cited

U.S. PATENT DOCUMENTS

2020/0075813 A1    3/2020  Joo et al.
2020/0075822 A1    3/2020  Suich et al.
2020/0381592 A1*  12/2020  Itakura ................... H01L 23/13

* cited by examiner

SUPPORT STRUCTURES FOR LIGHT EMITTING DIODE PACKAGES

FIELD OF THE DISCLOSURE

The present disclosure relates to solid-state lighting devices including light-emitting diodes (LEDs), and more particularly to support structures for packaged LED devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. LED packages have been developed that can provide mechanical support, electrical connections, and encapsulation for LED emitters. Light emissions that exit surfaces of LED emitters may then interact with elements or surfaces of corresponding LED packages, thereby increasing opportunities for light loss. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to support structures for packaged LED devices. Support structure arrangements are provided for LED packages with increased reflectivity. As disclosed herein, support structures may include patterned electrically conductive materials that provide electrical connections and bonding surfaces for LED chips within the package, and bonding surfaces for cover structures in certain arrangements. Depending on the wavelengths of light emitted by the LED package, light reflectivity tradeoffs can exist for conductive materials that provide suitable electrical connections and bonding surfaces. As disclosed herein, patterned layers with increased reflectivity may be provided on underlying electrically conductive materials. The patterned layers with increased reflectivity may be arranged in areas of the LED package where light may impinge surfaces of the LED package that are outside of one or more of a die attach area and a cover structure mounting area for the LED package.

In one aspect, an LED package comprises: a submount comprising a first face and a second face that opposes the first face; at least one LED chip on the first face of the submount; a cover structure arranged over the at least one LED chip; a first patterned trace on the first face of the submount, the first patterned trace forming at least one die attach pad for the at least one LED chip and wherein the cover structure is attached to the first patterned trace at a cover structure mounting area that is outside of the at least one die attach pad; a second patterned trace on the first patterned trace, wherein the second patterned trace is provided on a portion of the first patterned trace that is between the at least one die attach pad and the cover structure mounting area. In certain embodiments, the second patterned trace comprises a material that is different than the first patterned trace. In certain embodiments, the second patterned trace comprises aluminum and the first patterned trace comprises copper. In certain embodiments, the second patterned trace comprises aluminum and the first patterned trace comprises gold. In certain embodiments, the at least one LED chip is configured to provide a peak wavelength in a range from 100 nm to 315 nm. In certain embodiments, the cover structure mounting area is devoid of the second patterned trace. In certain embodiments, a portion of the second patterned trace is arranged between the cover structure and the first patterned trace at the cover structure mounting area. In certain embodiments, at least a portion of the second patterned trace is self-aligned with at least one edge of the first patterned trace. In certain embodiments, the cover structure comprises one or more of glass, ceramic, and quartz. In certain embodiments, the cover structure forms a lens over the at least one LED chip. In certain embodiments, the cover structure is attached to the submount to form a sealed cavity over the at least one LED chip. In certain embodiments, the LED package further comprises a reflector structure that is arranged between the cover structure and the submount at the cover structure mounting area. The reflector structure may comprise a sidewall that is coated with a metal.

In another aspect, an LED package comprises: a submount comprising a first face and a second face that opposes the first face; at least one LED chip on the first face of the submount; a cover structure arranged over the at least one LED chip; a first patterned trace on the first face of the submount, the first patterned trace forming at least one die attach pad for the at least one LED; and a second patterned trace on the first face of the submount, wherein the second patterned trace is provided between the at least one die attach pad and a peripheral edge of the submount, and the cover structure is attached to the second patterned trace at a cover structure mounting area. In certain embodiments, the second patterned trace comprises aluminum and the first patterned trace comprises copper. In certain embodiments, the second patterned trace comprises aluminum and the first patterned trace comprises gold. In certain embodiments, the at least one LED chip is configured to provide a peak wavelength in a range from 100 nm to 315 nm. In certain embodiments, the cover structure mounting area is devoid of the first patterned trace. In certain embodiments, the cover structure comprises one or more of glass, ceramic, and quartz. In certain embodiments, the cover structure is attached to the submount to form a sealed cavity over the at least one LED chip. In certain embodiments, the LED package further comprises a reflector structure that is arranged between the cover structure and the submount at the cover structure mounting area. The reflector structure may comprise a sidewall that is coated with a metal.

In another aspect, an LED package comprises: a submount comprising a first face and a second face that opposes the first face; at least one LED chip on the first face of the submount; a cover structure arranged over the at least one LED chip, the cover structure being mounted to the submount at a cover structure mounting area that is spaced from a peripheral boundary of the at least one LED chip, and a portion of the cover structure extends below a height of the at least one LED chip at the cover structure mounting area; and a metal layer on the first face of the submount, wherein the metal layer is arranged between the peripheral boundary of the at least one LED chip and the cover structure mounting area. In certain embodiments, the at least one LED chip is configured to provide a peak wavelength in a range from 100 nm to 315 nm. In certain embodiments, the metal layer comprises aluminum. In certain embodiments, the cover structure mounting area is devoid the metal layer. In certain embodiments, the cover structure is attached to the metal layer. In certain embodiments, the cover structure forms a sealed cavity over the at least one LED chip. In certain embodiments, the metal layer is electrically isolated from the at least one LED chip. In certain embodiments, the LED package further comprises a reflector structure that is arranged between the cover structure and the submount at the cover structure mounting area. The reflector structure may comprise a sidewall that is coated with a metal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
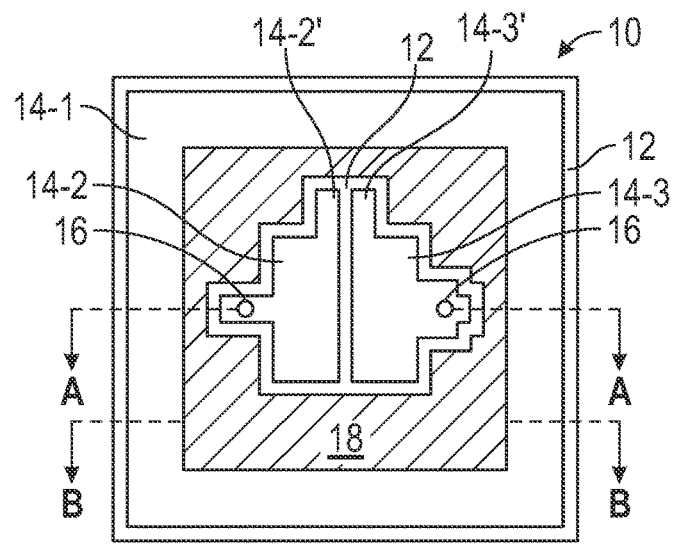
FIG. 1 is a top view of a portion of a light-emitting diode (LED) package that includes a first patterned trace and a second patterned trace that are provided on a submount according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to support structures for packaged LED devices. Support structure arrangements are provided for LED packages with increased reflectivity. As disclosed herein, support structures may include patterned electrically conductive materials that provide electrical connections and bonding surfaces for LED chips within the package, and bonding surfaces for cover structures in certain arrangements. Depending on the wavelengths of light emitted by the LED package, light reflectivity tradeoffs can exist for conductive materials that provide suitable electrical connections and bonding surfaces. As disclosed herein, patterned layers with increased reflectivity may be provided on underlying electrically conductive materials. The patterned layers with increased reflectivity may be arranged in areas of the LED package where light may impinge surfaces of the LED package that are outside of one or more of a die attach area and a cover structure mounting area for the LED package.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz). Superstrates may be patterned to enhance light extraction as described in commonly-assigned U.S. Patent Application Publication No. 2019/0326484 entitled "Semiconductor Light Emitting Devices Including Superstrates With Patterned Surfaces" which is hereby incorporated by reference herein. Superstrates may also be configured as described in commonly-assigned U.S. Pat. No. 10,290,777, also incorporated by reference herein. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents, which are hereby incorporated by reference herein: U.S. Pat. Nos. 8,866,169; 9,070,850; 9,887,327; and 10,468,565.

According to aspects of the present disclosure LED packages may include one or more elements, such as lumiphoric materials, encapsulants, light-altering materials, lens, and electrical contacts, among others, that are provided with one or more LED chips. In certain aspects, an LED package may include a support member, such as a submount or a lead frame. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

In certain aspects, light-altering materials may be provided in a preformed sheet or layer that includes light-altering particles suspended in a binder. For example, light-altering particles may be suspended in a binder of silicone that is not fully cured to provide the preformed sheet of light-altering materials. A desired thickness or height of the preformed sheet may be provided by moving a doctor blade or the like across the sheet. The preformed sheet may then be positioned on and subsequently formed around an LED chip and/or a wavelength conversion element that is on the LED chip. For example, the preformed sheet may be laminated around the LED chip and/or wavelength conversion element and then the preformed sheet may be fully cured in place. One or more portions of the preformed sheet may then be removed from a primary light-emitting face of the LED chip and/or wavelength conversion element. In this manner, light-altering materials may be formed along peripheral edges or sidewalls of the LED chip and wavelength conversion element with thicknesses not previously possible with conventional dispensing techniques typically used to form light-altering materials. Additionally, light-altering materials may be provided without needing conventional submounts or lead frames as support for conventional dispensing and/or molding techniques. In this regard, LED devices with light-altering materials may be provided with reduced footprints suitable for closely-spaced LED arrangements.

Aspects of the present disclosure are provided that may include support structures for LED packages. A support structure may refer to a structure of an LED package that supports one or more other elements of the LED package, including but not limited to LED chips and cover structures. In certain embodiments, a support structure may include a submount on which an LED chip is mounted. Suitable materials for a submount include, but are not limited to, ceramic materials such as aluminum oxide or alumina, AlN, or organic insulators like polyimide (PI) and polyphthalamide (PPA). In other embodiments a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Aspects of the present disclosure are provided in the context of support structures for LED chips that may emit light in any number of wavelength ranges, including wavelengths within UV and/or visible light spectrums.

As previously described, UV LEDs are of particular interest for use in applications related to the disinfection of microorganisms in air, water, and surfaces, among others. In other applications, UV LEDs may also be provided with one or more lumiphoric materials to provide aggregated broad emissions with improved color quality in the visible spectrum. Certain embodiments of the present disclosure may be well suited for applications where LED emissions are provided in one or more of the UV-A, UV-B, and UV-C wavelength ranges. Lower peak wavelengths, such as peak wavelengths in one or more of the UV-B (e.g., 280 nm to 315 nm) and the UV-C (e.g., 100 nm to 280 nm) may have high energy levels that can lead to breakdown of materials commonly used in other LED packages, including silicone, polymers, and/or other organic materials that are commonly used as encapsulants and/or binders for reflective particles and/or lumiphoric materials. Cover structures for UV-based LED packages may also need to provide protection from external environmental exposure, such as providing hermetic sealing and the like. In this manner, cover structures for UV LEDs may include at least one of glass, quartz, and/or ceramic materials that provide reduced breakdown from exposure to UV emissions while also being able to be attached or otherwise bonded to package support structures to seal underlying LED chips.

Support structures for LED packages may include one or more electrically conductive materials that may provide electrical connections to LED chips. Electrically conductive materials may be provided as traces or patterned traces on a submount, or the electrically conductive materials may form a lead frame structure that may or may not include a corresponding submount. The electrically conductive materials may include any number of materials, including copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the electrically conductive materials may include ENEPIG or ENIG that include a top layer of Au. In other embodiments, electrically conductive materials may include a top layer of Ag. For UV-B and UV-C wavelength spectrums, Au and Ag exhibit poor reflectivity (e.g., about 20% to 40% reflectivity). Aspects of the present disclosure provide improved support structures for LED packages that provide increased reflectivity, particularly for UV-B and UV-C applications.

FIG. 1 is a top view of a portion of an LED package 10 that includes portions 14-1 to 14-3 of a first patterned trace, referred to herein collectively as the first patterned trace 14, and a second patterned trace 18 that are provided on a submount 12 according to principles of the present disclosure. The first patterned trace 14 may form several discontinuous portions 14-1 to 14-3 on the submount 12. For example, the discontinuous portions 14-2 and 14-3 of the first patterned trace 14 may form a die attach pad for an LED chip where one of the discontinuous portions 14-2, 14-3 forms an anode pad of the die attach pad, and the other of the discontinuous portions 14-2, 14-3 forms a corresponding cathode pad of the die attach pad. In this manner, an LED chip may be flip-chip mounted to the die attach pad. Vias 16 may be provided that electrically connect the discontinuous portions 14-2, 14-3 to corresponding electrical connections on a backside of bottom face of the submount 10. In certain embodiments, protrusions 14-2', 14-3' of the discontinuous portions 14-2, 14-3 may extend away from the die attach pad area to form an attach area for another element, such as an electrical overstress element (e.g., ESD chip, Zener diode, etc.) that may be coupled in parallel with the LED chip. As illustrated, portions of the submount 12 between and around the discontinuous portions 14-2, 14-3 are devoid or uncovered by the first patterned trace 14. In certain embodiments, the discontinuous portion 14-1 may be provided on the submount 12 around a perimeter of the discontinuous portions 14-2, 14-3.

The first patterned trace 14 may include one or more layers of copper, gold, ENEPIG, ENIG, and the like that exhibit reduced reflectivity for UV-B and UV-C emissions. In certain embodiments, the second patterned trace 18 is selectively provided on the first patterned trace 14. In FIG. 1, the second patterned trace 18 is provided on portions of the discontinuous portion 14-1 (as better illustrated in the cross-sectional views of FIGS. 5A-6B). The second patterned trace 18 may include any material that exhibits increased reflectivity for certain LED emissions compared with the first patterned trace 14, such as at least 60% reflectivity, or at least 80% reflectivity, or at least 90% reflectivity. By way of example, for UV-B and UV-C wavelengths, aluminum may provide at least 90% reflectivity while materials of the first patterned trace 14 may exhibit reflectivity below 40%. As will be later described in greater detail, cover structures may be mounted to the submount 12 with metallurgical bonding materials. While the second patterned trace 18 may exhibit increased reflectivity, metallurgical bonding materials may have improved adhesion to materials of the first patterned trace 14. In this regard, the second patterned trace 18 is selectively provided on the first patterned trace 14 to allow cover structure mounting areas with direct access to the first patterned trace 14. In FIG. 1, portions of the discontinuous portion 14-1 that are devoid or uncovered by the second patterned trace 18 form a cover structure mounting area that is provided about a perimeter of the surface of the submount 12. Accordingly, a cover structure for the LED package 10 may be mounted such that the cover structure contacts the submount 12 only in the cover structure mounting area. In this manner, the second patterned trace 18 is provided on a portion of the first patterned trace 14 that is between the die attach pad (e.g., 14-2, 14-3) and the cover structure mounting area.

Figure 2:
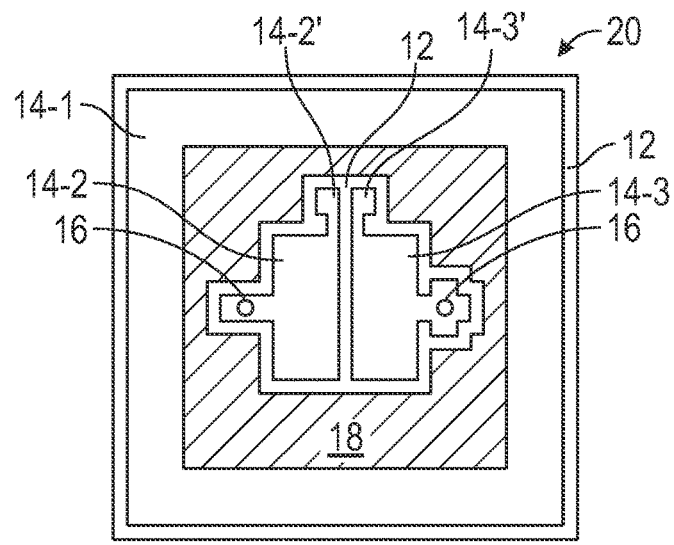
FIG. 2 is a top view of a portion of an LED package that is similar to the LED package of FIG. 1, but includes an alternative layout of the first patterned trace according to principles of the present disclosure.

FIG. 2 is a top view of a portion of an LED package 20 that is similar to the LED package 10 of FIG. 1, but includes an alternative layout of the first patterned trace 14 according to principles of the present disclosure. As illustrated, the protrusions 14-2', 14-3' of the discontinuous portions 14-2, 14-3 extend away from the die attach pad area with a different shape than what is illustrated in FIG. 1. In FIG. 2, the protrusions 14-2', 14-3' include ends with increased surface area for accommodating one or more electrical overstress elements (e.g., ESD chip, Zener diode, etc.) that may be coupled in parallel with an LED chip that may be mounted on the die attach pad. In FIG. 2, the second patterned trace 18 forms a rectangular or square shape that corresponds with a rectangular or square shape of the submount 12.

Figure 3:
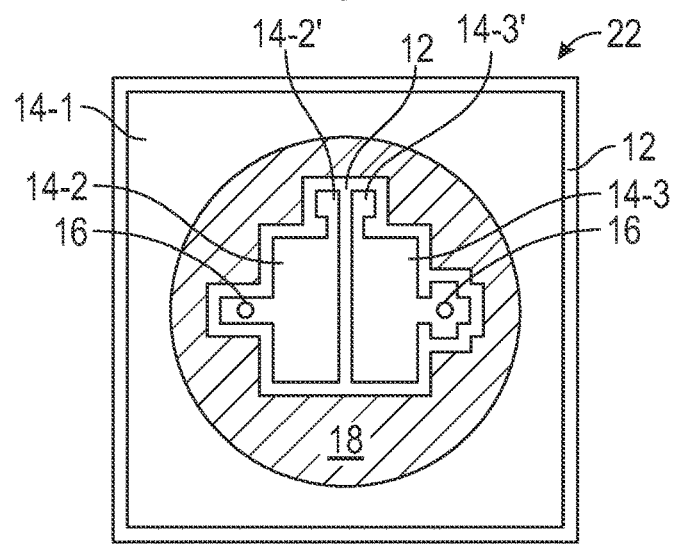
FIG. 3 is a top view of a portion of an LED package that is similar to the LED package of FIG. 1, but includes an alternative layout of the second patterned trace according to principles of the present disclosure.

FIG. 3 is a top view of a portion of an LED package 22 that is similar to the LED package 10 of FIG. 1, but includes an alternative layout of the second patterned trace 18 according to principles of the present disclosure. As illustrated, the second patterned trace 18 forms a circular shape on the discontinuous portion 14-1 of the first patterned trace 14. In this regard, the cover structure mounting area that is formed by areas of the discontinuous portion 14-1 that are devoid or uncovered by the second patterned trace 18 also is provided with a corresponding circular pattern. Such an arrangement may be well suited for cover structures that include domed lenses that are mounted over the submount 12. In other embodiments, the arrangement may be well suited for cover structures with flat lenses.

Figure 4A:
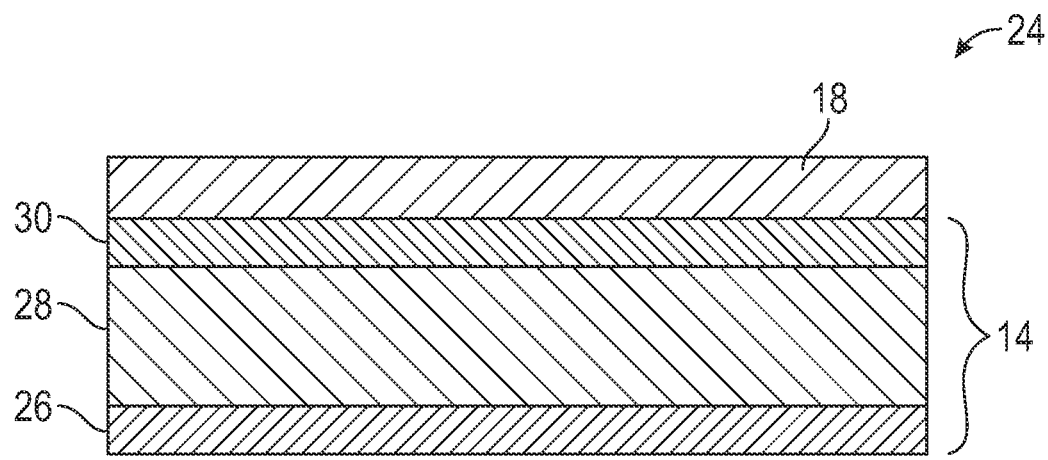
FIG. 4A is a cross-sectional view of the first patterned trace and the second patterned trace according to certain embodiments.

FIG. 4A is a cross-sectional view 24 of the first patterned trace 14 and the second patterned trace 18 according to certain embodiments. FIG. 4A may represent any embodiments of the present disclosure from areas where the second patterned trace 18 is formed on the first patterned trace 14 (e.g., the discontinuous portion 14-1 of FIGS. 1-3). As illustrated, the first patterned trace 14 may embody a multiple layer structure, such as a first layer 26, a second layer 28, and a third layer 30 of the first patterned trace 14. In certain embodiments, the first layer 26 may form an adhesion layer for an underlying submount and may include a material, such as titanium (Ti) and alloys thereof. The second layer 28 may include a layer of Cu and/or alloys thereof, and the third layer 30 may include one or more layers of Ni, palladium (Pd), and Au and/or alloys thereof. The second layer 28 and the third layer 30 may include electrolytic layers and may be collectively referred to as an ENEPIG layer. In certain embodiments, the third layer 30 may comprise Au such that an interface between the first patterned trace 14 and the second patterned trace 18 includes an interface between Au and Al. Depending on the embodiment, the second patterned trace 18 may be provided with a thickness in a range from 0.05 microns (μm) to 100 μm, or in a range from 0.05 μm to 50 μm, or in a range from 0.05 μm to 25 μm, or in a range from 0.05 μm to 10 μm.

Figure 4B:
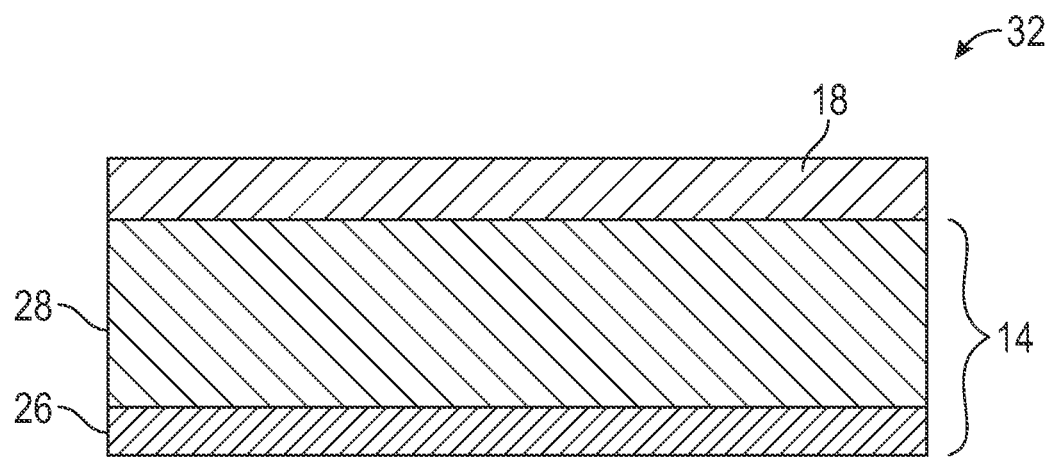
FIG. 4B is a cross-sectional view of the first patterned trace and the second patterned trace according to other embodiments.

FIG. 4B is a cross-sectional view 32 of the first patterned trace 14 and the second patterned trace 18 according to other embodiments. FIG. 4B is similar to FIG. 4A, except the first patterned trace 14 includes only the first layer 26, or adhesion layer, and the second layer 28 (e.g., Cu). In this regard, any of the embodiments of the present disclosure may also include an interface between the first patterned trace 14 and the second patterned trace 18 that includes an interface between Cu and Al.

While the following embodiments as set out in FIGS. 5A-10B will be described where the first patterned trace 14 is configured as described in FIG. 4A, any of the following embodiments as set out in FIGS. 5A-10B may also be configured where the first patterned trace 14 is configured as described in FIG. 4B.

Figure 5A:
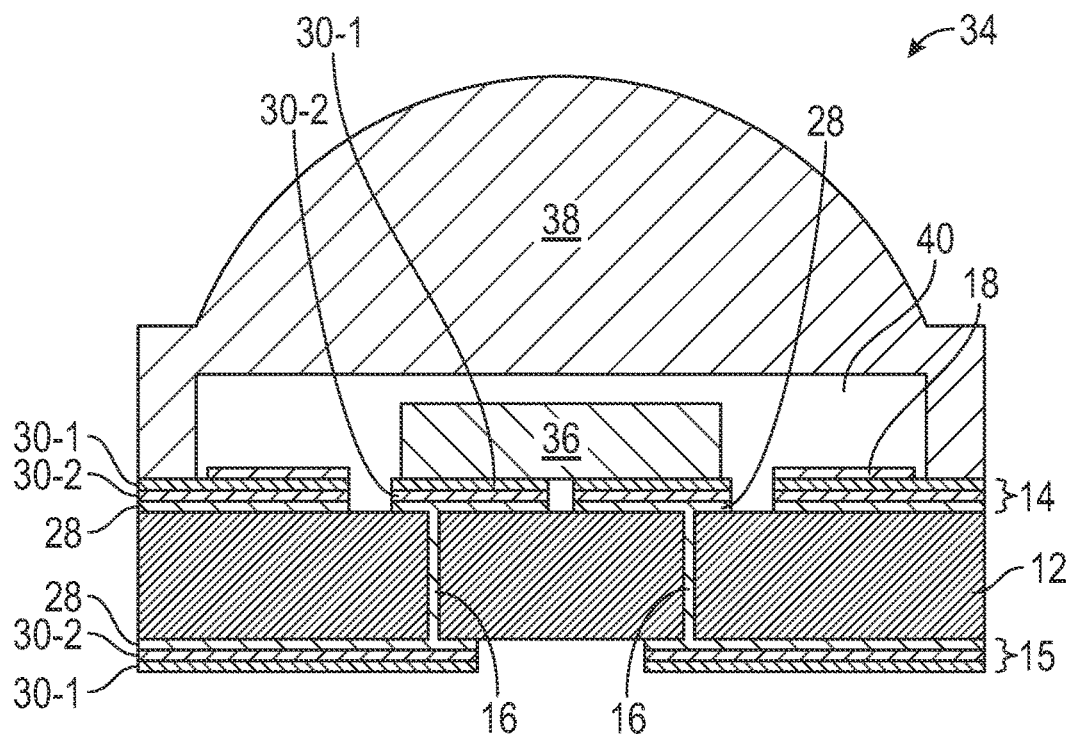
FIG. 5A is a cross-sectional view of an LED package taken along a portion of the LED package that is similar to the sectional line A-A of FIG. 1 and wherein the LED package is assembled with at least one LED chip and a cover structure according to principles of the present disclosure.

FIG. 5A is a cross-sectional view of an LED package 34 taken along a portion of the LED package 34 that is similar to the sectional line A-A of FIG. 1 and wherein the LED package 34 is assembled with at least one LED chip 36 and a cover structure 38 according to principles of the present disclosure. As illustrated, the LED chip 36 is mounted on a die attach pad that is formed by portions of the first patterned trace 14 (e.g., portions 14-2, 14-3 of FIG. 1). The first patterned trace 14 may include the second layer 28 (e.g., Cu or the like) and a third layer 30-1, 30-2 as described for FIG. 4A. In FIG. 5A, the third layer 30-1, 30-2 is illustrated as two layers where the layer 30-1 may include Ni and Pd and the layer 30-2 may include Au. The vias 16 may extend through an entire thickness of the submount 12 to provide electrical connections between the LED chip 36 on a top face of the submount 12, and corresponding portions of a third patterned trace 15 that are provided on a bottom face of the submount 12. The third patterned trace 15 may be configured to receive external electrical connections for the LED package 34. Additionally, the third patterned trace 15 may be provided with a sufficient surface area across the bottom face of the submount 12 to improve thermal dissipation for the LED package 34. In certain embodiments, the third patterned trace 15 may include a similar arrangement as the second patterned trace 14. In other embodiments, the third patterned trace 15 may include a structure that is different than the second patterned trace 14.

The cover structure 38 may be formed over the LED chip 36 and the cover structure may be attached to the first patterned trace 14 at or near a perimeter of the LED package 34 at the cover structure mounting area. The cover structure 38 may include vertical sidewalls that extend to the submount 12 in one or more positions that are below a height of the LED chip 36. In this regard, the cover structure 38 may form a cavity 40 or opening over the LED chip 36 and over the submount 12. In certain embodiments, the cavity 40 may be filled with air and/or nitrogen. In certain embodiments, the cavity 40 may be under a vacuum relative to a surrounding atmosphere, depending on how the cover structure 38 is attached. In certain embodiments, the cover structure 38 forms a hermetic seal for the LED package 34. As illustrated, the cover structure mounting area is defined where the cover structure 38 is attached to the first patterned trace 14 at or near a perimeter of the submount 12. In certain embodiments, the cover structure 38 may form a lens with a domed or hemispherical shape for directing light emissions from the LED chip 36. In certain embodiments, the lens may comprise many different shapes depending on the desired shape of the light output. Suitable shapes include hemispheric, ellipsoid, ellipsoid bullet, cubic, flat, hex-shaped and square. In certain embodiments, a suitable shape includes both curved and planar surfaces, such as a hemispheric or curved top portion with planar side surfaces. As illustrated in FIG. 5A, ends of the curved top portion of the cover structure 38 may be aligned with corresponding ends of the cavity 40.

As previously described, while materials of the first patterned trace 14 may provide good adhesion for mounting the LED chip 36 and the cover structure 38, the materials of the first patterned trace 14 may have unsuitable reflectivity, particularly for embodiments where the LED chip 36 provides UV-B and/or UV-C light. In this regard, the second patterned trace 18 is provided on portions of the first patterned trace 14 that are between the die attach pad of the LED chip 36 and the cover structure mounting area. The second patterned trace 18 may include a metal with increased reflectivity for wavelengths of light from the LED chip 36 as compared with the first patterned trace 14. In certain embodiments, the second patterned trace 18 comprises Al and/or alloys thereof. Al provides increased reflectivity, particularly for UV-B and/or UV-C light. Conventional LED packages may have sought to avoid Al in such configurations since Al can be difficult for bonding LED chips, Al can add costs to the LED packages, and Al may not be as reflective as conventional white solder mask materials used in conventional LED packages. However, conventional white solder mask materials may degrade under UV-B and/or UV-C emissions. As illustrated, at least a portion of the second patterned trace 18 may be self-aligned to at least one edge of the first patterned trace 14.

Figure 5B:
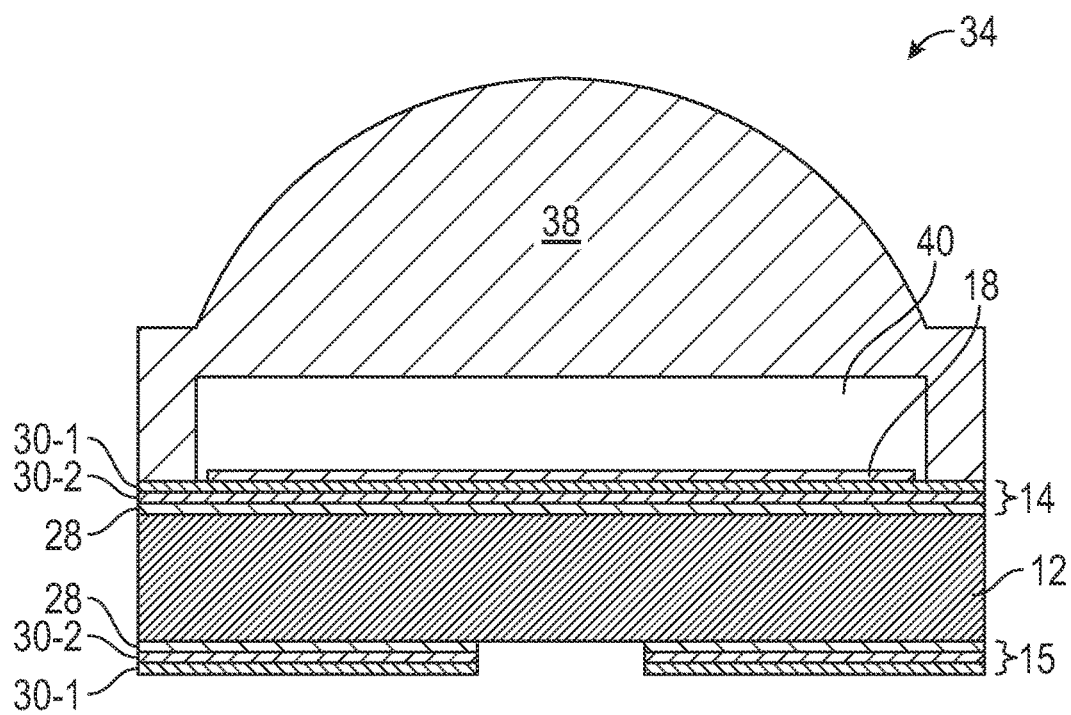
FIG. 5B is a cross-sectional view of the LED package of FIG. 5A taken along a portion of the LED package that is similar to the sectional line B-B of FIG. 1 in an area that is outside the LED chip.

FIG. 5B is a cross-sectional view of the LED package 34 of FIG. 5A taken along a portion of the LED package 34 that is similar to the sectional line B-B of FIG. 1 in an area that is outside the LED chip 36. As illustrated, the second patterned trace 18 may be provided along substantially all of the first patterned trace 14 that is outside the LED chip 36 and within the cavity 40 to provide increased reflectivity. In FIGS. 5A and 5B, the second patterned trace 18 is illustrated with a small gap near the cover structure 38 to provide mounting tolerances for the cover structure 38. In other embodiments, the second patterned trace 18 may extend entirely from one end of the cavity 40 to the other without any gaps.

Figure 6A:
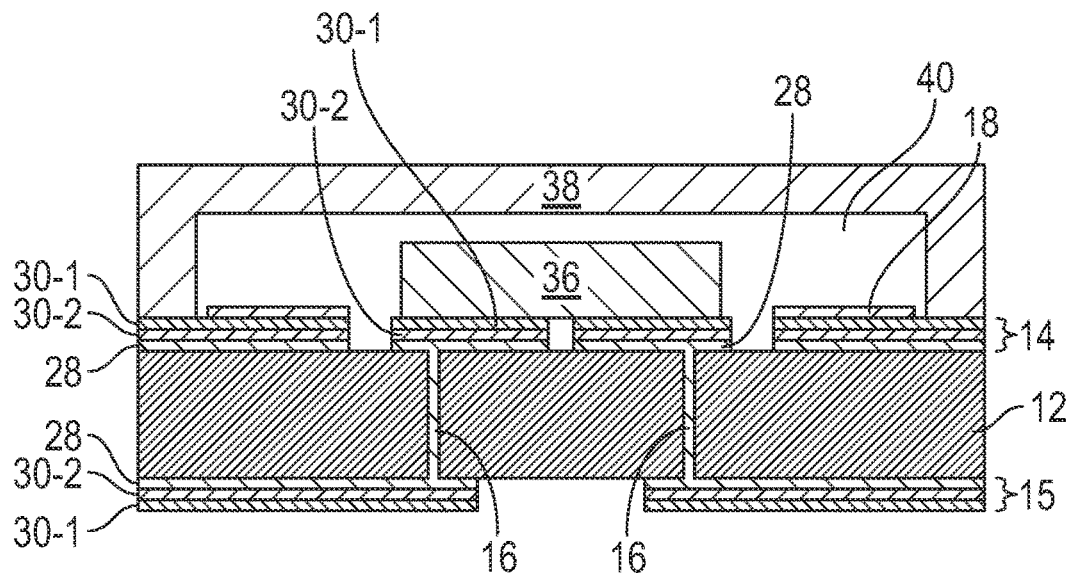
FIG. 6A is a cross-sectional view of an LED package that is similar to the LED package of FIGS. 5A and 5B, but where the cover structure forms a flat or planar cover of the LED package.
Figure 6B:
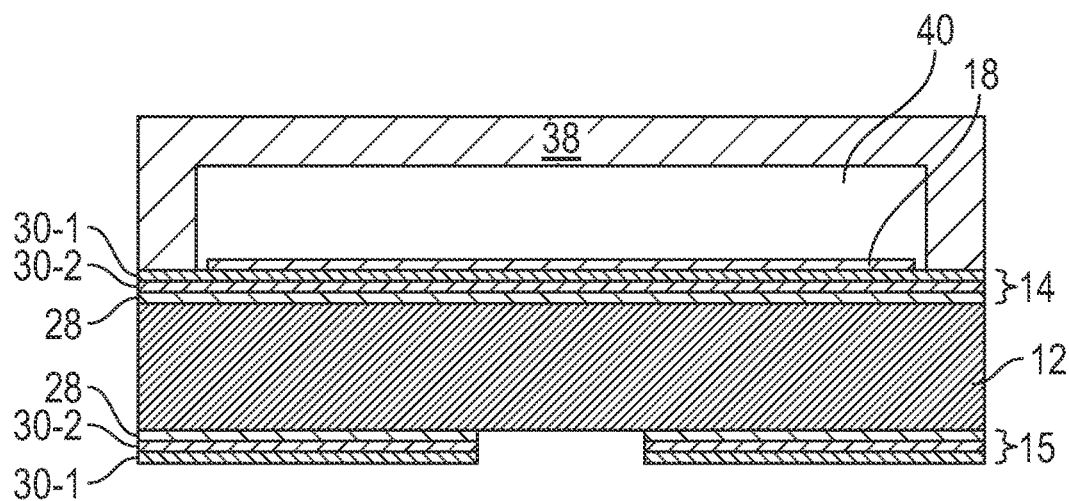
FIG. 6B is a cross-sectional view of the LED package of FIG. 6A taken along a portion of the LED package that is similar to the sectional line B-B of FIG. 1 in an area that is outside the LED chip.

FIG. 6A is a cross-sectional view of an LED package 42 that is similar to the LED package 34 of FIGS. 5A and 5B. The cross-sectional view provided in FIG. 6A is taken along a similar portion of the LED package 42 as provided for the view of the LED package 34 in FIG. 5A. FIG. 6B is a cross-sectional view of the LED package 42 of FIG. 6A taken along a portion of the LED package 42 that is similar to the sectional line B-B of FIG. 1 in an area that is outside the LED chip 36. The LED package 42 is similar to the LED package 34 of FIGS. 5A and 5B; however, the cover structure 38 forms a flat or planar cover over the submount 12 with vertical sidewalls that extend to the submount 12 in a position that is below a height of the LED chip 36. In this regard, the LED package 42 may be provided with a lower profile for certain applications.

Figure 7A:
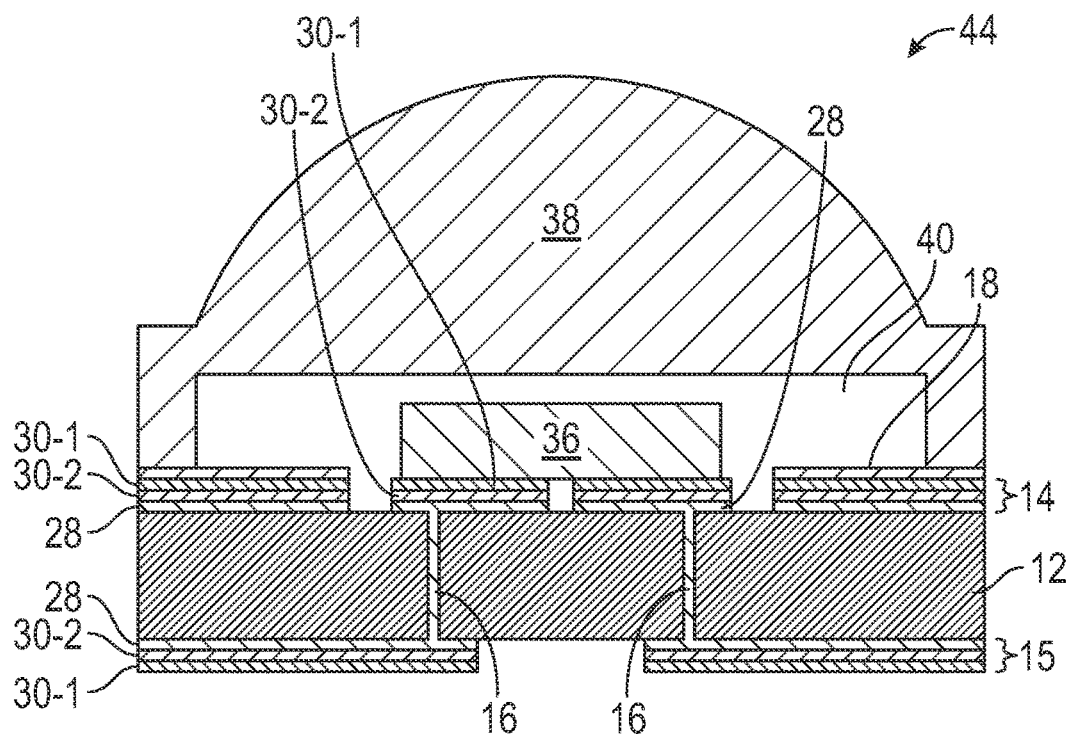
FIG. 7A is a cross-sectional view of an LED package taken along a portion of the LED package that is similar to the sectional line A-A of FIG. 1 and where the second patterned trace is provided between the cover structure and the submount in the cover structure mounting area according to principles of the present disclosure.
Figure 7B:
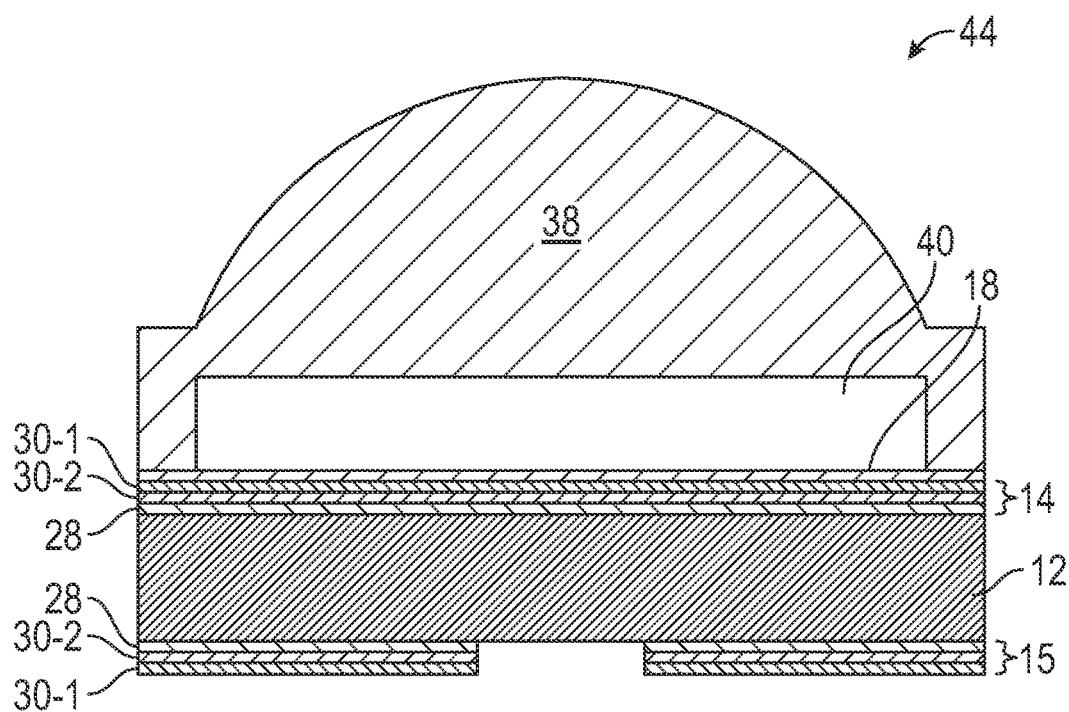
FIG. 7B is a cross-sectional view of the LED package of FIG. 7A taken along a portion of the LED package that is similar to the sectional line B-B of FIG.

FIG. 7A is a cross-sectional view of an LED package 44 taken along a portion of the LED package 44 that is similar to the sectional line A-A of FIG. 1 and where the second patterned trace 18 is provided between the cover structure 38 and the submount 12 in the cover structure mounting area according to principles of the present disclosure. FIG. 7B is a cross-sectional view of the LED package 44 of FIG. 7A taken along a portion of the LED package 44 that is similar to the sectional line B-B of FIG. 1. The LED package 44 is similar to the LED package 34 of FIGS. 5A and 5B, except the second patterned trace 18 extends between the cover structure 38 and the submount 12 in the cover structure mounting area. In this regard, the second patterned trace 18 may cover an entire area of the first patterned trace 14 that is discontinuous with the die attach pad for the LED chip 36. Such a configuration may be well suited for embodiments where the cover structure 38 comprises a material that does not require metallurgical attachment, such as glass or the like. In this regard, reflectivity may be increased in the cover structure mounting areas of the LED package 44, particularly for UV-B and UV-C emissions.

Figure 8A:
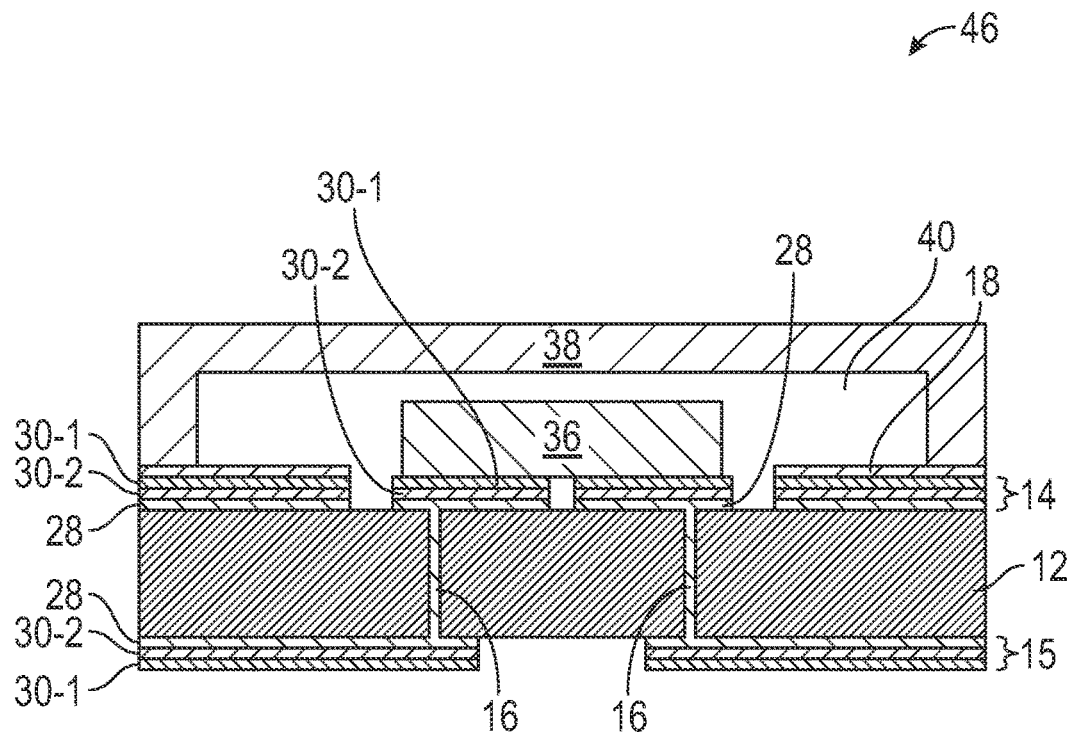
FIG. 8A is a cross-sectional view of an LED package that is similar to the LED package of FIGS. 6A and 6B, but where the cover structure forms a flat or planar cover of the LED package.
Figure 8B:
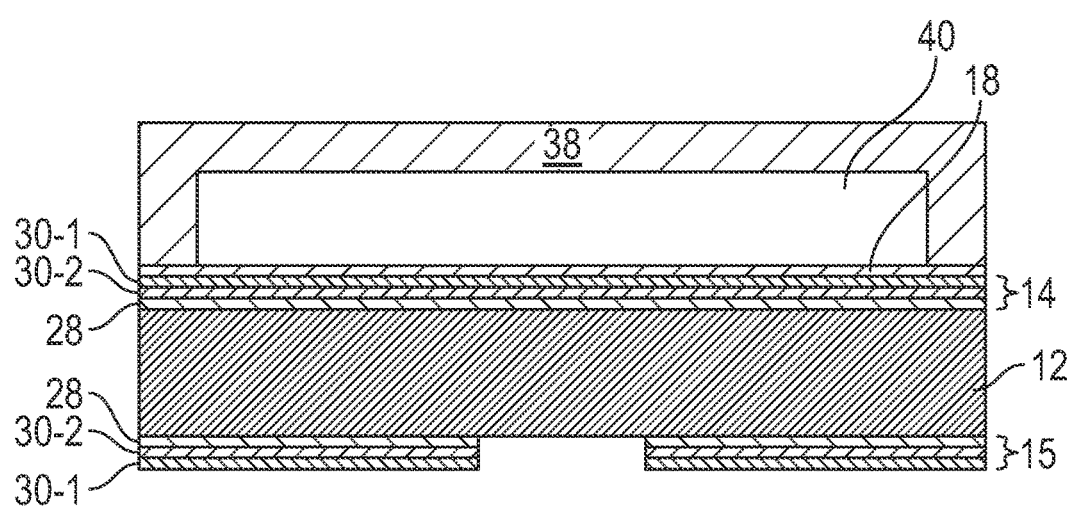
FIG. 8B is a cross-sectional view of the LED package of FIG. 8A taken along a portion of the LED package that is similar to the sectional line B-B of FIG. 1 in an area that is outside the LED chip.

FIG. 8A is a cross-sectional view of an LED package 46 that is similar to the LED package 42 of FIGS. 6A and 6B. The cross-sectional view provided in FIG. 8A is taken along a similar portion of the LED package 46 as provided for the view of the LED package 42 in FIG. 6A. FIG. 8B is a cross-sectional view of the LED package 46 of FIG. 8A taken along a portion of the LED package 46 that is similar to the sectional line B-B of FIG. 1 in an area that is outside the LED chip 36. The LED package 46 is similar to the LED package 44 of FIGS. 7A and 7B, but include embodiments where the cover structure 38 forms a flat or planar cover over the submount 12 with vertical sidewalls that extend to the submount 12 in a position that is below a height of the LED chip 36. In this regard, the LED package 46 may be provided with a lower profile for certain applications.

Figure 9A:
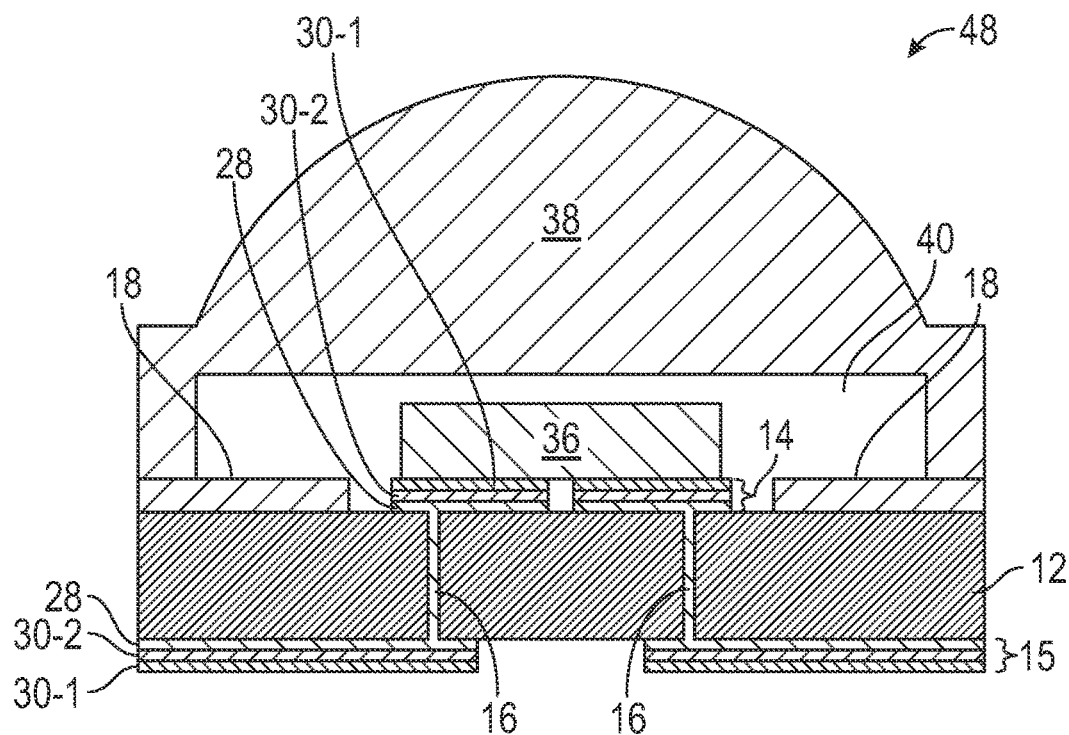
FIG. 9A is a cross-sectional view of an LED package taken along a portion of the LED package that is similar to the sectional line A-A of FIG. 1 and wherein the first patterned trace is not provided in the cover structure mounting area according to principles of the present disclosure.
Figure 9B:
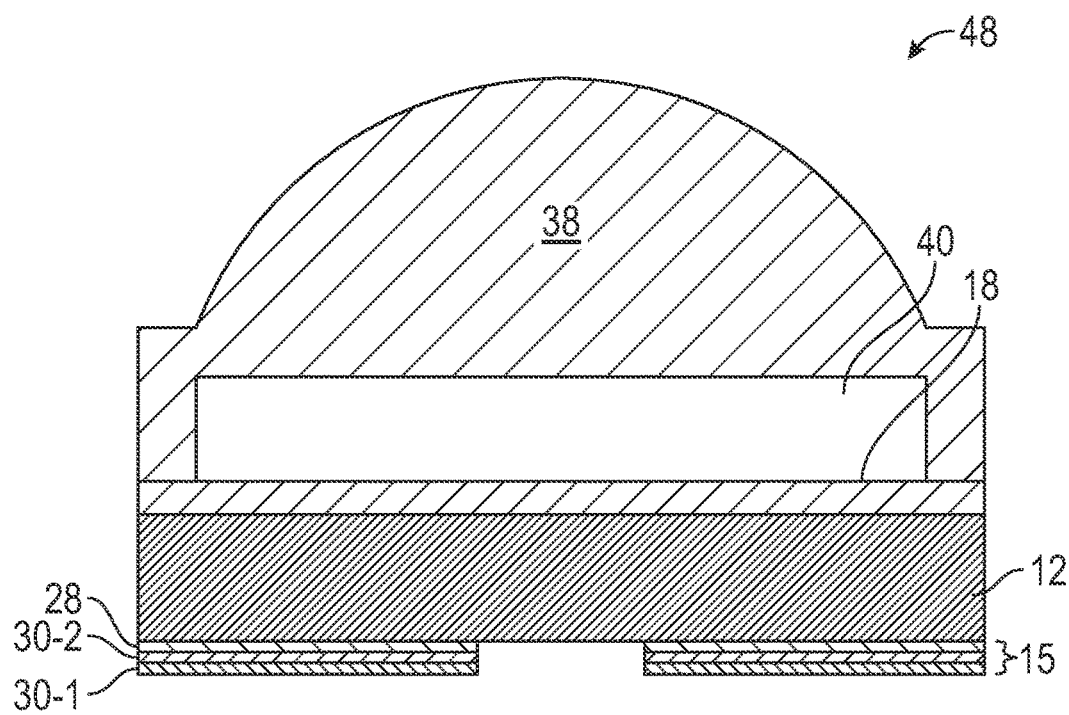
FIG. 9B is a cross-sectional view of the LED package of FIG. 9A taken along a portion of the LED package that is similar to the sectional line B-B of FIG. 1 in an area that is outside the LED chip.

FIG. 9A is a cross-sectional view of an LED package 48 taken along a portion of the LED package 48 that is similar to the sectional line A-A of FIG. 1 and wherein the first patterned trace 14 is not provided in the cover structure mounting area according to principles of the present disclosure. FIG. 9B is a cross-sectional view of the LED package 48 of FIG. 9A taken along a portion of the LED package 48 that is similar to the sectional line B-B of FIG. 1 in an area that is outside the LED chip 36. As illustrated, the first patterned trace 14 may only be provided in areas of the submount 12 that form the die attach pad (e.g., 14-2, 14-3 of FIG. 1). In this regard, the second patterned trace 18 may be provided on areas of the submount 12 that peripherally surround the LED chip 36 and the first patterned trace 14 and are devoid of the first patterned trace 14. Accordingly, the cover structure mounting area includes the second patterned trace 18 and not the first patterned trace 14. As illustrated, the second patterned trace 18 may include a similar thickness as the first patterned trace 14 to facilitate bonding of the cover structure. In other embodiments, the second patterned trace 18 may include a thickness that is greater than or less than a thickness of the first patterned trace 14.

Figure 10A:
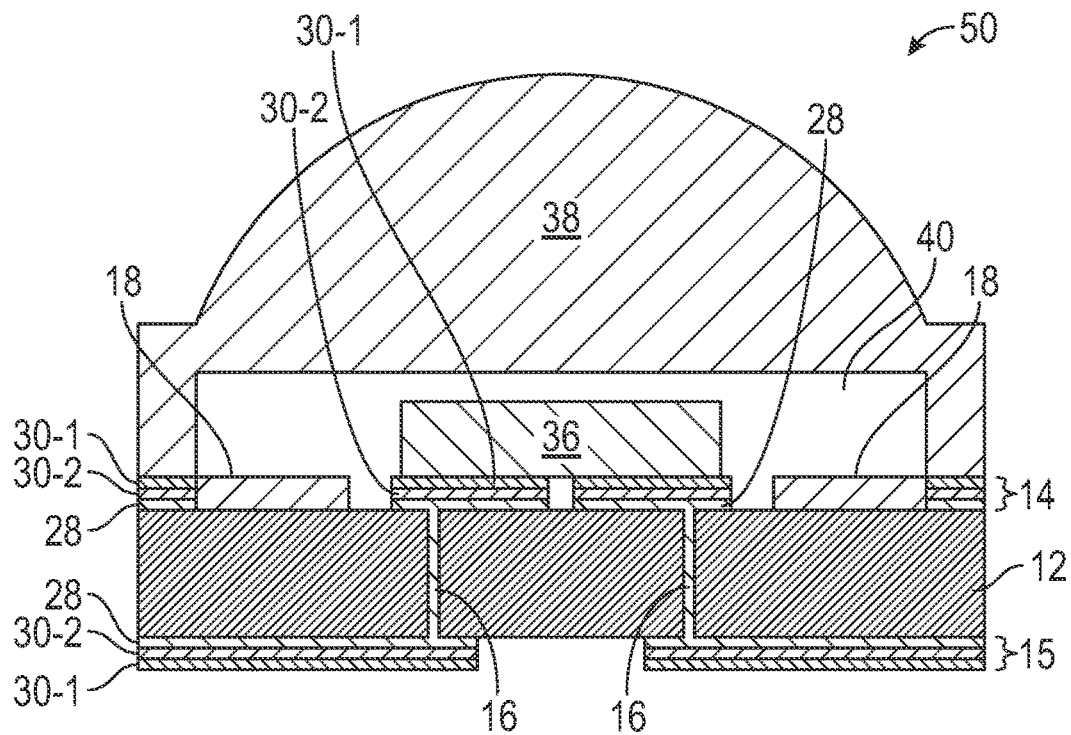
FIG. 10A is a cross-sectional view of an LED package taken along a portion of the LED package that is similar to the sectional line A-A of FIG. 1 and wherein the first patterned trace is not provided between the second patterned trace and the submount according to principles of the present disclosure.
Figure 10B:
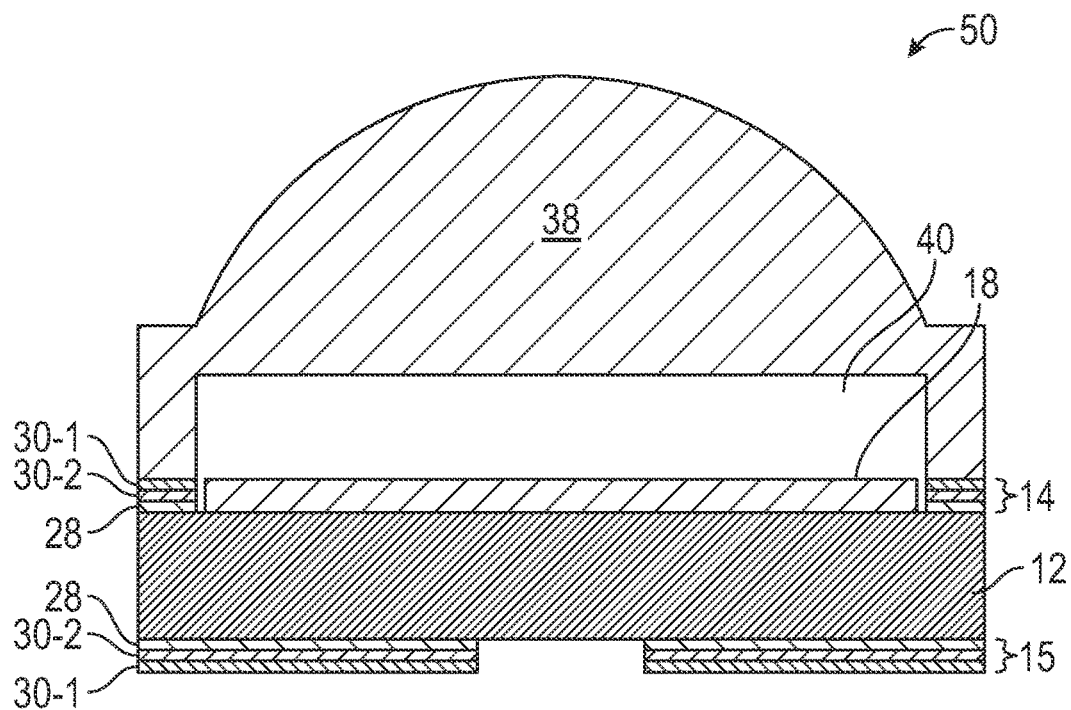
FIG. 10B is a cross-sectional view of the LED package of FIG. 10A taken along a portion of the LED package that is similar to the sectional line B-B of FIG. 1 in an area that is outside the LED chip.

FIG. 10A is a cross-sectional view of an LED package 50 taken along a portion of the LED package 50 that is similar to the sectional line A-A of FIG. 1 and wherein the first patterned trace 14 is not provided between the second patterned trace 18 and the submount 12 according to principles of the present disclosure. FIG. 10B is a cross-sectional view of the LED package 50 of FIG. 10A taken along a portion of the LED package 50 that is similar to the sectional line B-B of FIG. 1 in an area that is outside the LED chip 36. As illustrated, the first patterned trace 14 is provided in an area of the submount 12 for the die attach pad and an area for the submount 12 for the cover structure mounting area. In this regard, the second patterned trace 18 may cover portions of the submount 12 within the cavity 40 that are uncovered by the first patterned trace 14. In a similar manner to the LED package 48 of FIGS. 9A and 9B, the second patterned trace 18 may include a thickness that is greater than, less than, or the same as a thickness of the first patterned trace 14.

Figure 11:
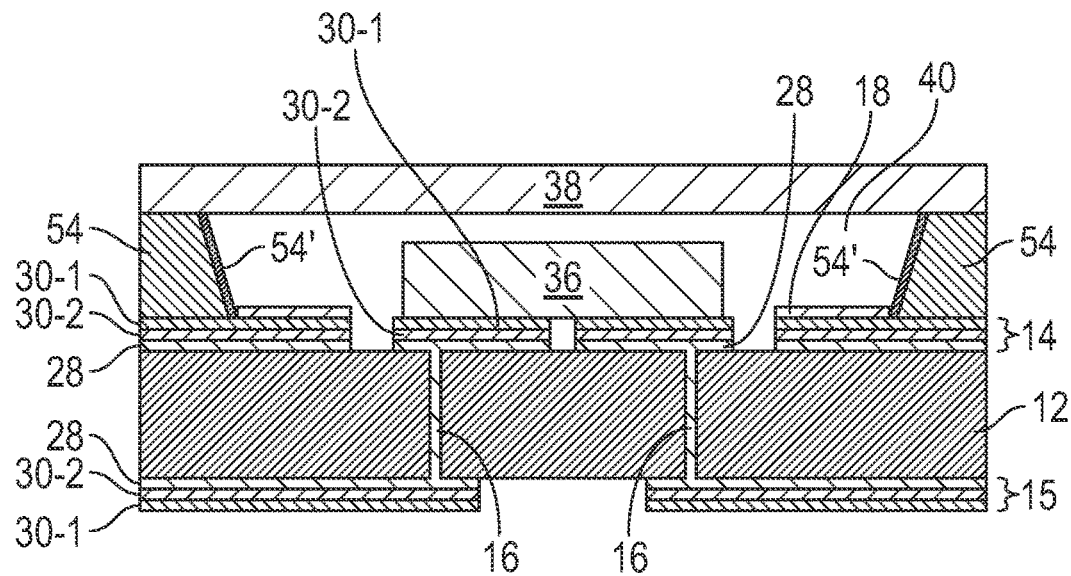
FIG. 11 is a cross-sectional view of an LED package taken along a portion of the LED package that is similar to the sectional line A-A of FIG. 1 and wherein the LED package includes a reflector structure arranged between the cover structure and the submount.

FIG. 11 is a cross-sectional view of an LED package 52 taken along a portion of the LED package 52 that is similar to the sectional line A-A of FIG. 1 and wherein the LED package 52 includes a reflector structure 54 arranged between the cover structure 38 and the submount 12. In certain embodiments, the reflector structure 54 is a separate element that may be mounted or otherwise attached to one or more of the first patterned trace 14 and the submount 12. As illustrated, the cover structure 38 may be attached to the reflector structure 54, and the reflector structure 54 (and cover structure 38) are attached to the cover structure mounting area that is provided around a periphery of the LED chip 36. In FIG. 11, the cover structure mounting area of the submount 12 may be defined as where the reflector structure 54 is mounted to the first patterned trace 14. The reflector structure 54 may comprise internal sidewalls 54' that define lateral boundaries of the cavity 40. In certain embodiments, the sidewalls 54' may be angled with respect to the submount 12 to redirect laterally emitted light from the LED chip 36 through the cover structure 38 in a desired emission direction for the LED package 52. In other embodiments, the sidewalls 54' may form a vertical sidewall that is substantially perpendicular with the submount 12 while still redirecting lateral light emissions from the LED chip 36. The reflector structure 54 may include a material with a sufficient coefficient of thermal expansion (CTE) relative to other portions of the LED package 52. In certain embodiments, the reflector structure 54 comprises silicon with a metal coating, for example aluminum or alloys thereof, on the sidewalls 54'. In other embodiments, the entire reflector structure 54 may comprise a metal, such as aluminum or alloys thereof. In still other embodiments, the reflector structure 54 may comprise a ceramic, such as one or more of aluminum oxide ($Al_2O_3$), zirconium dioxide ($ZrO_2$), silicon dioxide ($SiO_2$), and aluminum (AlN). For embodiments where the reflector structure 54 comprises a ceramic material, the sidewalls 54' may be coated with a metal as described above for added reflectivity. As illustrated, the second patterned trace 18 is provided on exposed portions of the first patterned trace 14 within the cavity 40 to provide increased reflectivity for emissions from the LED chip 36. While the cover structure 38 is illustrated as planar in FIG. 11, the cover structure 38 may form a lens with a domed or hemispherical shape for directing light emissions from the LED chip 36. In certain embodiments, the lens may comprise many different shapes depending on the desired shape of light output from the LED package 52. Suitable shapes include hemispheric, ellipsoid, ellipsoid bullet, cubic, flat, hex-shaped and square. In certain embodiments, a suitable shape includes both curved and planar surfaces, such as a hemispheric or curved top portion with planar side surfaces.

Figure 12:
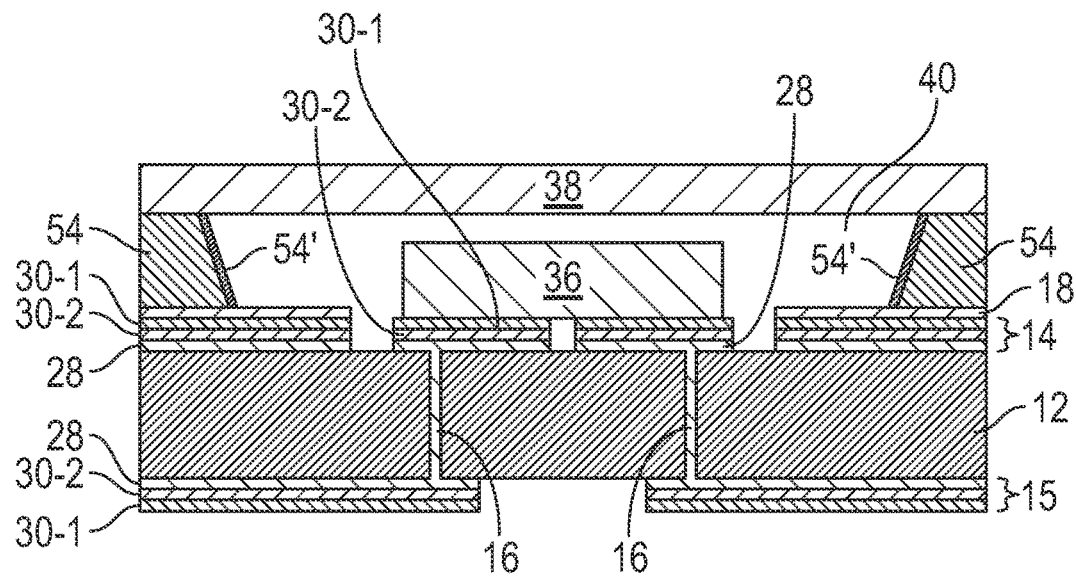
FIG. 12 is a cross-sectional view of an LED package that is similar to the LED package of FIG. 11, except the second patterned trace extends on the first patterned trace in a position that is between the reflector structure and the submount.

FIG. 12 is a cross-sectional view of an LED package 56 that is similar to the LED package 52 of FIG. 11, except the second patterned trace 18 extends on the first patterned trace 14 in a position that is between the reflector structure 54 and the submount 12. In this regard, the reflector structure 54 may be bonded directly to the second patterned trace 18. Such a configuration may be well suited for embodiments where the cover structure 38 comprises a material that does not require metallurgical attachment, such as glass or the like. Additionally, while the cover structure 38 is illustrated as planar in FIG. 12, the cover structure 38 may form a lens with any of the shapes as described above for FIG. 11.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) package comprising:
   a submount comprising a first face and a second face that opposes the first face;
   at least one LED chip on the first face of the submount;
   a cover structure arranged over the at least one LED chip;
   a first patterned trace on the first face of the submount, the first patterned trace forming at least one die attach pad for the at least one LED chip and wherein the cover structure is attached to the first patterned trace at a cover structure mounting area that is outside of the at least one die attach pad;

a second patterned trace on the first patterned trace, wherein the second patterned trace is provided on a portion of the first patterned trace that is between the at least one die attach pad and the cover structure mounting area.

2. The LED package of claim 1, wherein the second patterned trace comprises a material that is different than the first patterned trace.

3. The LED package of claim 1, wherein the second patterned trace comprises aluminum and the first patterned trace comprises copper.

4. The LED package of claim 1, wherein the second patterned trace comprises aluminum and the first patterned trace comprises gold.

5. The LED package of claim 1, wherein the at least one LED chip is configured to provide a peak wavelength in a range from 100 nm to 315 nm.

6. The LED package of claim 1, wherein the cover structure mounting area is devoid of the second patterned trace.

7. The LED package of claim 1, wherein a portion of the second patterned trace is arranged between the cover structure and the first patterned trace at the cover structure mounting area.

8. The LED package of claim 1, wherein at least a portion of the second patterned trace is self-aligned with at least one edge of the first patterned trace.

9. The LED package of claim 1, wherein the cover structure comprises one or more of glass, ceramic, and quartz.

10. The LED package of claim 1, wherein the cover structure forms a lens over the at least one LED chip.

11. The LED package of claim 1, wherein the cover structure is attached to the submount to form a sealed cavity over the at least one LED chip.

12. The LED package of claim 1, further comprising a reflector structure that is arranged between the cover structure and the submount at the cover structure mounting area.

13. The LED package of claim 12, wherein the reflector structure comprises a sidewall that is coated with a metal.

14. A light emitting diode (LED) package comprising:
a submount comprising a first face and a second face that opposes the first face;
at least one LED chip on the first face of the submount;
a cover structure arranged over the at least one LED chip such that a cavity is formed over the at least one LED chip and the submount;
a first patterned trace on the first face of the submount, the first patterned trace forming at least one die attach pad for the at least one LED chip; and
a second patterned trace on the first face of the submount, wherein the second patterned trace is provided between the at least one die attach pad and a peripheral edge of the submount such that the entire second patterned trace is laterally separated from the first patterned trace, the cover structure is attached to the second patterned trace at a cover structure mounting area, and a portion of the second patterned trace is exposed within the cavity in a position that is between the at least one die attach pad and the cover structure mounting area.

15. The LED package of claim 14, wherein the second patterned trace comprises aluminum and the first patterned trace comprises copper.

16. The LED package of claim 14, wherein the second patterned trace comprises aluminum and the first patterned trace comprises gold.

17. The LED package of claim 14, wherein the at least one LED chip is configured to provide a peak wavelength in a range from 100 nm to 315 nm.

18. The LED package of claim 14, wherein the cover structure mounting area is devoid of the first patterned trace.

19. The LED package of claim 14, wherein the cover structure comprises one or more of glass, ceramic, and quartz.

20. The LED package of claim 14, wherein the cavity is a sealed cavity over the at least one LED chip.

21. The LED package of claim 14, further comprising a reflector structure that is arranged between the cover structure and the submount at the cover structure mounting area.

22. The LED package of claim 21, wherein the reflector structure comprises a sidewall that is coated with a metal.

23. A light emitting diode (LED) package comprising:
a submount comprising a first face and a second face that opposes the first face;
at least one LED chip on the first face of the submount;
a cover structure arranged over the at least one LED chip, the cover structure being mounted to the submount at a cover structure mounting area that is spaced from a peripheral boundary of the at least one LED chip, and a portion of the cover structure extends below a height of the at least one LED chip at the cover structure mounting area; and
a metal layer on the first face of the submount, wherein the metal layer is arranged between the peripheral boundary of the at least one LED chip and the cover structure mounting area, the metal layer is electrically isolated from the at least one LED chip, and the cover structure mounting area is devoid of the metal layer.

24. The LED package of claim 23, wherein the at least one LED chip is configured to provide a peak wavelength in a range from 100 nm to 315 nm.

25. The LED package of claim 23, wherein the metal layer comprises aluminum.

26. The LED package of claim 23, wherein the cover structure forms a sealed cavity over the at least one LED chip.

27. The LED package of claim 23, further comprising a reflector structure that is arranged between the cover structure and the submount at the cover structure mounting area.

28. The LED package of claim 27, wherein the reflector structure comprises a sidewall that is coated with a metal.

* * * * *